US012652473B2

(12) United States Patent
Wang et al.

(10) Patent No.: US 12,652,473 B2
(45) Date of Patent: Jun. 9, 2026

(54) SYSTEMS AND METHODS FOR CONFIGURING MACRO READING BLOCK LOCATIONS WITH SHIFT REGISTERS

(71) Applicant: Samsung Electronics Co., Ltd., Suwon-si (KR)

(72) Inventors: Yibing Wang, Temple City, CA (US); Hongyu Wang, Pasadena, CA (US); Tze Ching Fung, Diamond Bar, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 136 days.

(21) Appl. No.: 18/363,650

(22) Filed: Aug. 1, 2023

(65) Prior Publication Data

US 2024/0373141 A1 Nov. 7, 2024

Related U.S. Application Data

(60) Provisional application No. 63/464,273, filed on May 5, 2023.

(51) Int. Cl.
| | |
|---|---|
| *H04N 25/443* | (2023.01) |
| *G11C 19/00* | (2006.01) |
| *H04N 25/76* | (2023.01) |
| *H04N 25/78* | (2023.01) |

(52) U.S. Cl.
CPC ....... *H04N 25/443* (2023.01); *H04N 25/7795* (2023.01); *H04N 25/78* (2023.01); *G11C 19/00* (2013.01)

(58) Field of Classification Search
CPC .. H04N 25/443; H04N 25/7795; H04N 25/78; G11C 19/00
See application file for complete search history.

(56) References Cited

U.S. PATENT DOCUMENTS

| | | | | |
|---|---|---|---|---|
| 4,858,020 A | * | 8/1989 | Homma | H04N 25/7795 348/E3.02 |
| 5,412,422 A | * | 5/1995 | Yamada | H04N 25/00 348/304 |
| 6,181,375 B1 | * | 1/2001 | Mitsui | H04N 25/443 348/240.99 |
| 6,972,791 B1 | * | 12/2005 | Yomeyama | H04N 25/78 348/304 |
| 7,283,167 B1 | * | 10/2007 | Schrey | H04N 25/40 348/E3.02 |
| 8,515,194 B2 | | 8/2013 | Srinivasan et al. | |

(Continued)

FOREIGN PATENT DOCUMENTS

| | | |
|---|---|---|
| CN | 102682454 B | 5/2013 |
| CN | 102811349 B | 10/2014 |

*Primary Examiner* — Lin Ye
*Assistant Examiner* — Chriss S Yoder, III
(74) *Attorney, Agent, or Firm* — Womble Bond Dickinson (US) LLP

(57) ABSTRACT

A system may include a first pixel array arranged in a first direction and a second direction, and a first shift register coupled to the first pixel array. An output signal of the first shift register may be configured to activate one or more pixels of the first pixel array. The activated pixels may form a first macro reading block, wherein the first shift register may be configured to receive a clock signal to move the first macro reading block in the first direction or the second direction.

20 Claims, 6 Drawing Sheets

(56)     References Cited

U.S. PATENT DOCUMENTS

| | | | |
|---|---|---|---|
| 8,654,852 | B2 | 2/2014 | Tseng et al. |
| 8,831,099 | B2 | 9/2014 | Parhy et al. |
| 9,294,778 | B2 | 3/2016 | Jalowiecki et al. |
| 11,006,132 | B1 | 5/2021 | Kalva et al. |
| 11,064,138 | B2 | 7/2021 | Diasparra et al. |

* cited by examiner

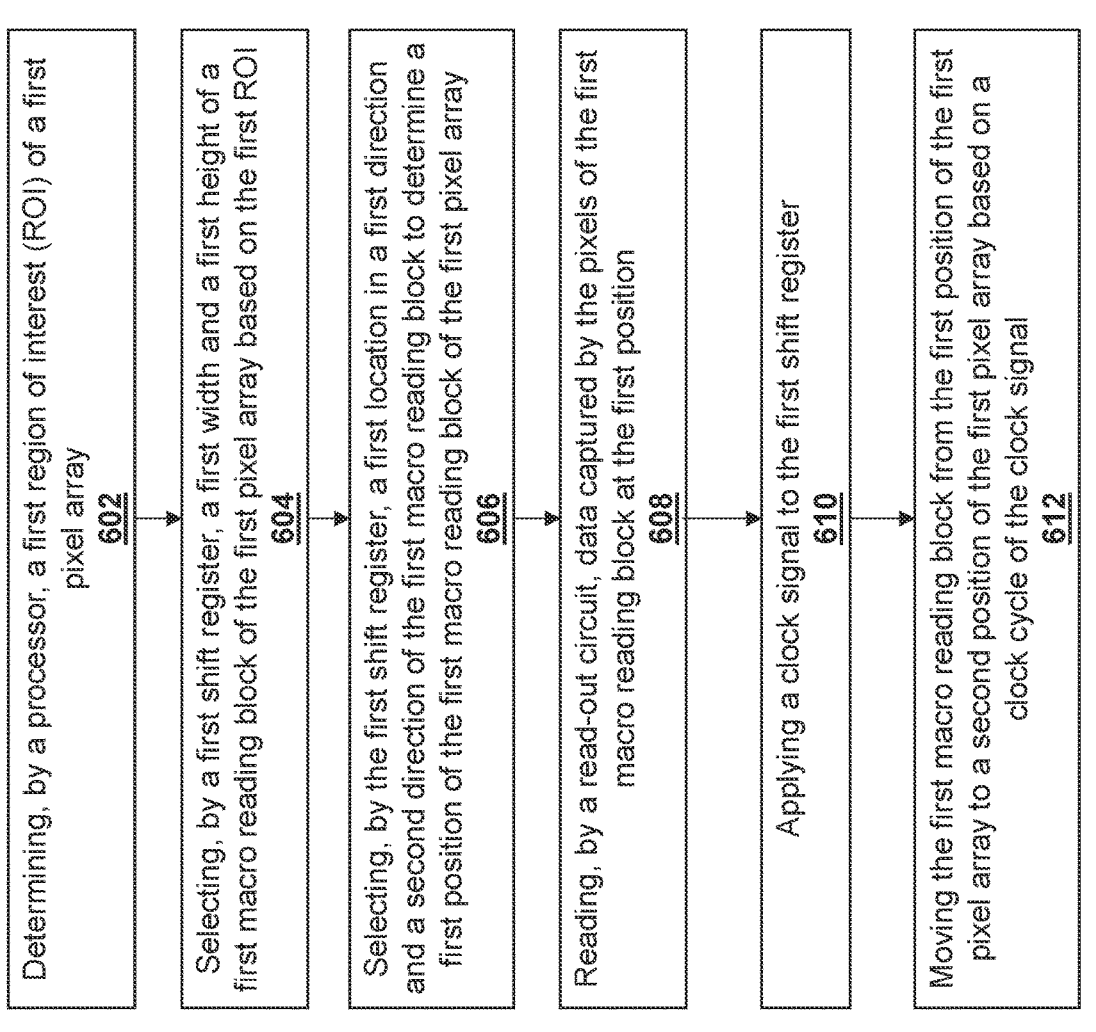

Determining, by a processor, a first region of interest (ROI) of a first pixel array
602

Selecting, by a first shift register, a first width and a first height of a first macro reading block of the first pixel array based on the first ROI
604

Selecting, by the first shift register, a first location in a first direction and a second direction of the first macro reading block to determine a first position of the first macro reading block of the first pixel array
606

Reading, by a read-out circuit, data captured by the pixels of the first macro reading block at the first position
608

Applying a clock signal to the first shift register
610

Moving the first macro reading block from the first position of the first pixel array to a second position of the first pixel array based on a clock cycle of the clock signal
612

FIG. 6

SYSTEMS AND METHODS FOR CONFIGURING MACRO READING BLOCK LOCATIONS WITH SHIFT REGISTERS

CROSS-REFERENCE TO RELATED APPLICATION(S)

This application claims priority to U.S. Provisional Patent Application No. 63/464,273 filed on May 5, 2023, which is incorporated herein by reference in its entirety.

FIELD

The present application generally relates to macro reading blocks for pixel arrays, and more particularly to systems and methods for configuring macro reading block locations with shift registers.

BACKGROUND

Sizes of sensor pixel array has increased rapidly over time. In many cases, it is desirable to read out only the pixels that have useful or interesting information. By reading out only these pixels of interest, less data will need to be transferred and/or stored in memory. The pixels of interest may be referred to as a region of interest (ROI) of the pixel array where the pixels are grouped to m×n subarray called macro reading block to capture data of interest. Depending on the application, the size of the macro block can be fixed or variable, and the location of the ROI or macro block does not necessarily have a fixed pattern. Thus, techniques for flexibly selecting such fixed or variable macro reading blocks are needed.

SUMMARY

According to a first embodiment, a system may include a first pixel array arranged in a first direction and a second direction; and a first shift register coupled to the first pixel array, an output signal of the first shift register configured to activate one or more pixels of the first pixel array, wherein the activated pixels form a first macro reading block, the first shift register configured to receive a clock signal to move the first macro reading block in the first direction or the second direction.

The system may further include a read-out circuit coupled to an output of the first pixel array to read data captured by the activated pixels of the first macro reading block.

The activating of the one or more pixels may include selecting: a width of the first macro reading block in the first direction; and a height of the first macro reading block in the second direction.

The activating of the one or more pixels may further include selecting: a first location of the first macro reading block in the first direction; and the first location of the first macro reading block in the second direction, the width, the height, and the first location of the first macro reading block forming a first region of interest (ROI) of the first pixel array.

The first macro reading block may be moved in the first direction or the second direction based on a second ROI of the first pixel array.

At least one pixel of the first ROI may overlap at least one pixel of the second ROI.

The pixels of the first ROI may be mutually exclusive of the pixels of the second ROI.

The system may further include a second pixel array arranged in the first direction and the second direction, the second pixel array being adjacent the first pixel array; and a second shift register coupled to the second pixel array, an output signal of the second shift register configured to activate one or more pixels of the second pixel array, wherein the activated pixels form a second macro reading block, the second shift register configured to receive the clock signal to move the second macro reading block in the first direction or the second direction.

The clock signal received by the first shift register may be the same clock signal received by the second shift register.

The second pixel array may be adjacent the first pixel array in the second direction, and the first macro reading block is configured to move independently of the second macro reading block.

According to a second embodiment, a method for reading pixels from the system according to the first embodiment is described. The method may include determining, by a processor, a first region of interest (ROI) of the first pixel array; selecting, by the first shift register, a first width and a first height of the first macro reading block of the first pixel array based on the first ROI; selecting, by the first shift register, a first location in the first direction and the second direction of the first macro reading block to determine a first position of the first macro reading block of the first pixel array; reading, by a read-out circuit, data captured by the pixels of the first macro reading block at the first position; applying a clock signal to the first shift register; and moving the first macro reading block from the first position of the first pixel array to a second position of the first pixel array based on a clock cycle of the clock signal.

According to a third embodiment, a method for reading pixels is described. The method may include: determining, by a processor, a first region of interest (ROI) of a first pixel array; selecting, by a first shift register, a first width and a first height of a first macro reading block of the first pixel array based on the first ROI; selecting, by the first shift register, a first location in a first direction and a second direction of the first macro reading block to determine a first position of the first macro reading block of the first pixel array; and reading, by a read-out circuit, data captured by the pixels of the first macro reading block at the first position.

The method may further include: applying a clock signal to the first shift register; and moving the first macro reading block from the first position of the first pixel array to a second position of the first pixel array based on a clock cycle of the clock signal.

The method may further include reading, by the read-out circuit, data captured by the pixels of the first macro reading block at the second position.

At least one pixel of the first macro reading block at the first position may overlap at least one pixel of the first macro reading block at the second position.

The pixels of the first macro reading block at the first position may be mutually exclusive of the pixels of the first macro reading block at the second position.

The method may further include: determining, by a processor, a second ROI of a second pixel array; selecting, by a second shift register, a second width and a second height of a second macro reading block of the second pixel array based on the second ROI; selecting, by the second shift register, a third location in the first direction and the second direction of the second macro reading block to determine a third position of the second macro reading block of the second pixel array; and reading, by the read-out circuit, data captured by the pixels of the second macro reading block at the second position.

The method may further include: applying the clock signal to the second shift register; and moving the second macro reading block from the third position of the second pixel array to a fourth position of the second pixel array based on the clock cycle of the clock signal.

The method may further include reading, by the read-out circuit, data captured by the pixels of the second macro reading block at the fourth position.

The first macro reading block at the first position may be adjacent the second macro reading block at the third position such that the first macro reading block and the second macro reading block are combined to form a third ROI larger than the first ROI or the second ROI.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIG. 2 is an example pixel array utilizing shift registers to configure macro reading blocks, according to various embodiments of the present disclosure.

FIG. 5 is an example pixel array utilizing shift registers to configure macro reading blocks, according to various embodiments of the present disclosure.

FIG. 6 is a flow chart of a method for configuring macro reading block locations with shift registers, according to various embodiments of the present disclosure.

Figure 1B:
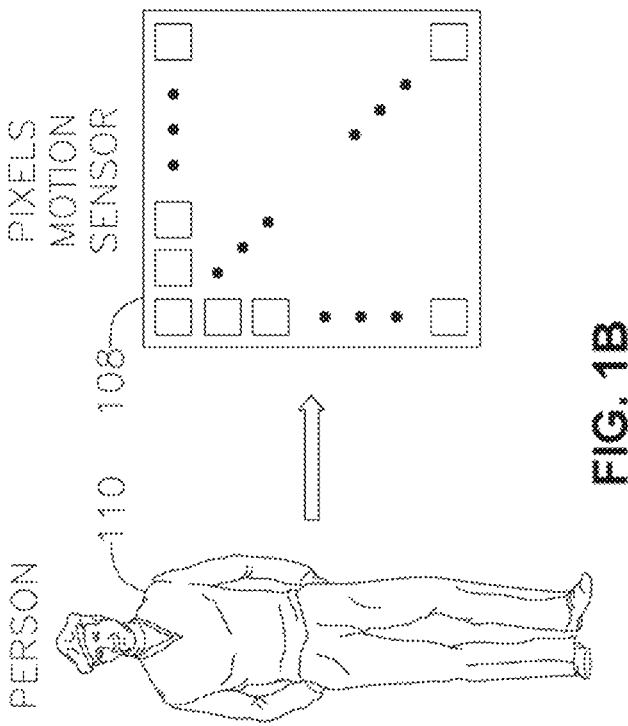
FIGS. 1A-1B are block diagrams of systems and applications that utilize pixel arrays, according to various embodiments of the present disclosure.

Embodiments of the present disclosure and their advantages are best understood by referring to the detailed description that follows. Unless otherwise noted, like reference numerals denote like elements throughout the attached drawings and the written description, and thus, descriptions thereof will not be repeated. In the drawings, the relative sizes of elements, layers, and regions may be exaggerated for clarity.

DETAILED DESCRIPTION

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Pixel arrays have a variety of uses in electronic devices and systems. Some common uses of pixel arrays include sensor pixels that may be used to sense signals (e.g., light waves by light sensors or heat by motion sensor). In the case of sensor pixel arrays, signals are sensed by the sensor pixels and the sensed signals may be read and then further processed by an application. When there are many sensors as in the case of a sensor pixel array, not every pixel needs to be actively sensing signals all the time. Thus, a row decoder or a column decoder may be used to select certain sensors to activate. Such pixels that are desired to be selected may be referred to as a region of interest (ROI). That is, only certain specific portions, sections, or regions, of the sensor pixel array may be of interest during a given moment in time for sensing signals. Thus, it is desirable to select only these pixels to read data from to reduce power consumption or reduce information traffic flow and ultimately reduce storage in memory.

Figure 1A:
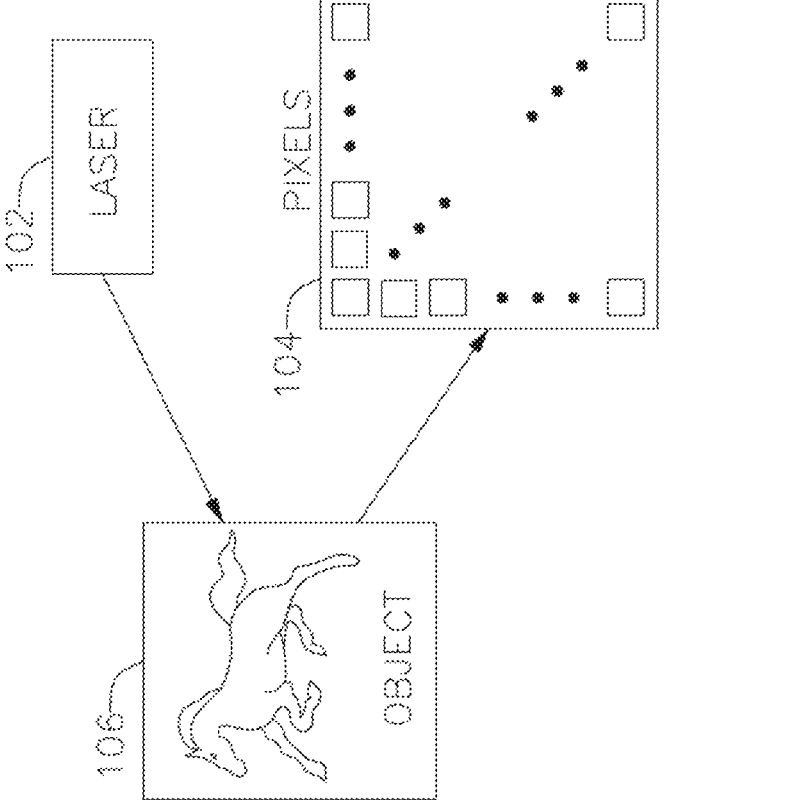

FIG. 1A is a block diagram of a LIDAR system comprising a light source 102 for transmitting light such as a laser beam and a pixel array of sensors 104 that are configured to sense or capture the light that is reflected off of an object 106 and returned back to the pixel array 104. Thus, the light that is reflected back to the pixel array may move around and change from one region of the pixel array to another region of the pixel array. In other words, the reflected light may not necessarily always be received at the same pixels or the same ROI of the pixels because the object may move thereby causing the reflected light to move. Therefore, as the location of the reflected light moves, it is desirable to move the ROI to the pixels that are of interest (i.e., where the light is being reflected to).

FIG. 1B is a block diagram of a pixel array of sensors that are configured to sense or capture heat from some source. For example, the sensors may include motion sensors 108 that are configured to sense heat generated off of a person 110 and detect that a person is present within a vicinity of the motion sensors 108. In this case, as the person moves, the ROI of the pixel arrays may also move, and therefore the sensors from which to read out data may also need to move.

A dynamic vision sensor (Dynamic Vison Sensor) system may also use a pixel array of sensors. These sensors may be asynchronous imagers, and similar to the human eye, the imagers may be configured to respond to changes in brightness with no "frames" to capture. Thus, with DVS, individual pixels of the array may independently generate an output only if there is a local change in measured brightness. As such, the image is continuously synthesized to form a temporal stream of events, typically on the order of a million events per second (Meps). Accordingly, only the pixels of the ROI are read. In some cases, pixels that are outside of the ROI may remain active to continue monitoring for changes but in other cases, for example, after calibration, unused pixels may be deactivated, and therefore not read, depending on the application.

Thus, by activating only the pixels in the ROI, power consumption and processing power may be reduced, and memory requirements may also be reduced because less information will be read out and transferred. Such ROI may be a group that may be referred to as a subarray or a macro reading block comprising an m×n number of pixels, wherein m corresponds to a number of pixels in one direction (e.g., along an x-axis direction) and n corresponds to a number of pixels in another direction (e.g., along a y-axis direction).

Thus, a group of m×n pixels may be a macro reading block of pixels that are selected to be active during a given moment in time. As desired by the application, the macro reading block may be shifted from one location of the pixel array to another location of the pixel array, and therefore the ROI may either be fixed or variable according to the application. Thus, it is desirable for techniques that can intelligently select a limited number of pixels instead of all the pixels.

Some systems may be configured to select whole columns or whole rows of pixels of the pixel array, and therefore read out an entire column or an entire row of pixels. Such systems may utilize address decoders that can select fixed coordinates of the pixel array by selecting a row or a column. Simple selection of rows or columns may be achievable by using an address decoder that takes a binary input and then generates a binary output that is connected to the pixel array to select a column or a row. However, when it is desirable to select arbitrary groups of pixels of varying sizes, simple address decoders may lack the flexibility to do so. Designing an address decoder that can select arbitrary pixels (i.e., those that do not fall under a single row or column but instead a variable m×n pixels) can result in a complex design that may potentially require an unreasonably large number of logic gates, which in turn may result in occupying a larger area of a circuit chip and may be computationally complex. Furthermore, when there is an array of pixels, routing of metal traces to from every pixel and connecting them to different nets and/or contact points on a chip may become more complex and difficult. Thus, improved techniques for flexibly and arbitrarily selecting groups of pixels are desired.

In some embodiments, shift registers may be used to improve the flexibility of selecting one or more pixels of a pixel array. More particularly, shift registers can be used instead of the address decoders discussed above.

Figure 2:
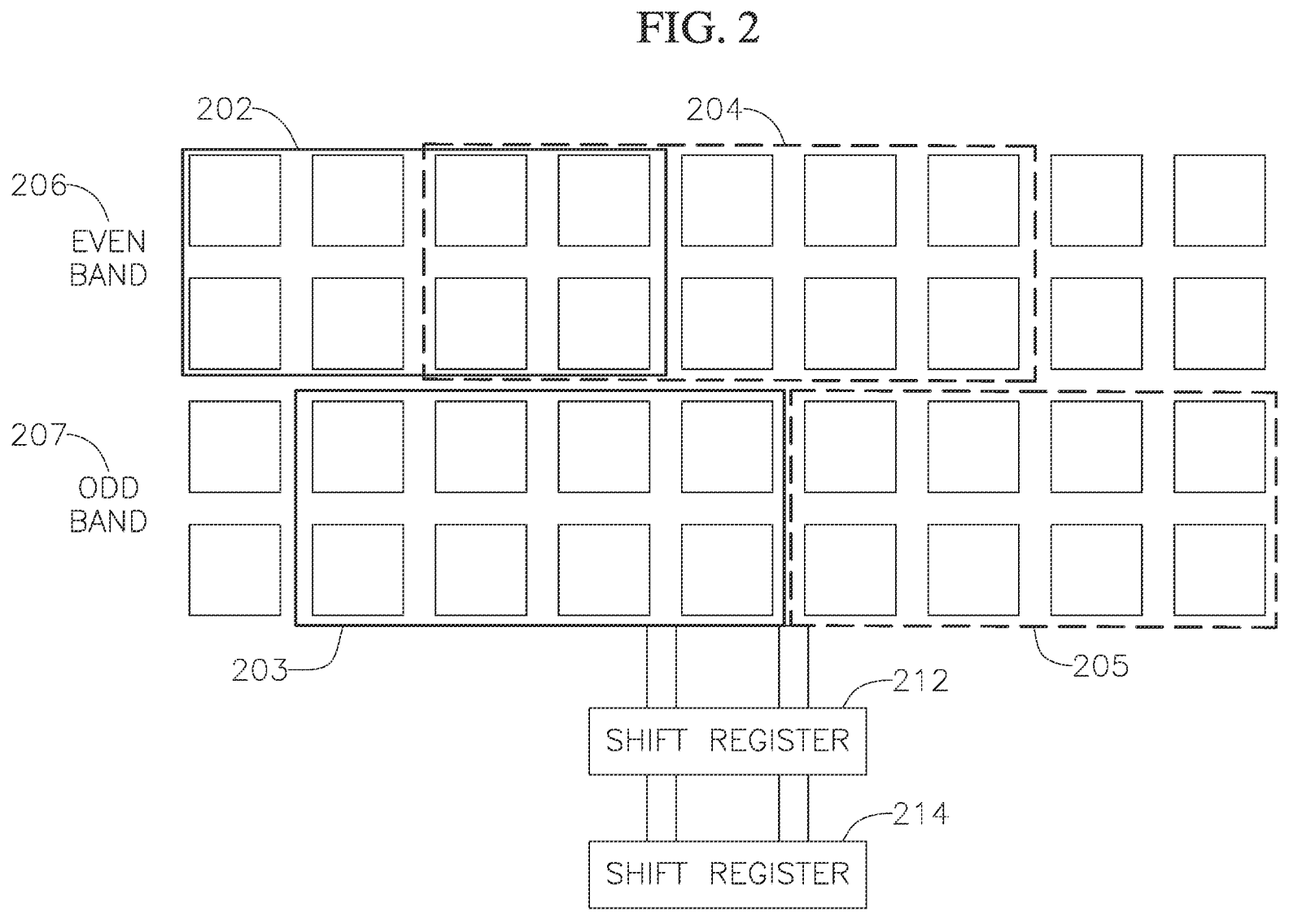

FIG. 2 is an example pixel array of sensors configured to sense signals (e.g., light wave signals). The sensors may be arranged in rows in a first direction and columns in a second direction, thus forming a pixel array of sensors. By way of example, and for illustrative purposes of the present disclosure only, four rows of pixels are shown in the first direction and nine columns of pixels are shown in the second direction. However, the described embodiments may be applicable to any number of rows and columns, e.g., 100 rows by 100 columns, 4096 rows by 4096 columns, etc. As described above, it may be desirable to read-out the pixels of only certain selected pixels rather than all of the pixels at a given moment. Accordingly, a plurality of pixels may be grouped to form a macro reading block, and this macro reading block may correspond to the ROI that a particular application desires to obtain information from. For example, box 202 is formed around eight pixels (4×2) in FIG. 2 to illustrate an example macro reading block. In some embodiments, one or more shift registers may be coupled to the pixel array and the output from the shift register may be used to select the eight pixels of the box 202 to read-out the information captured by these sensors.

Figure 3:
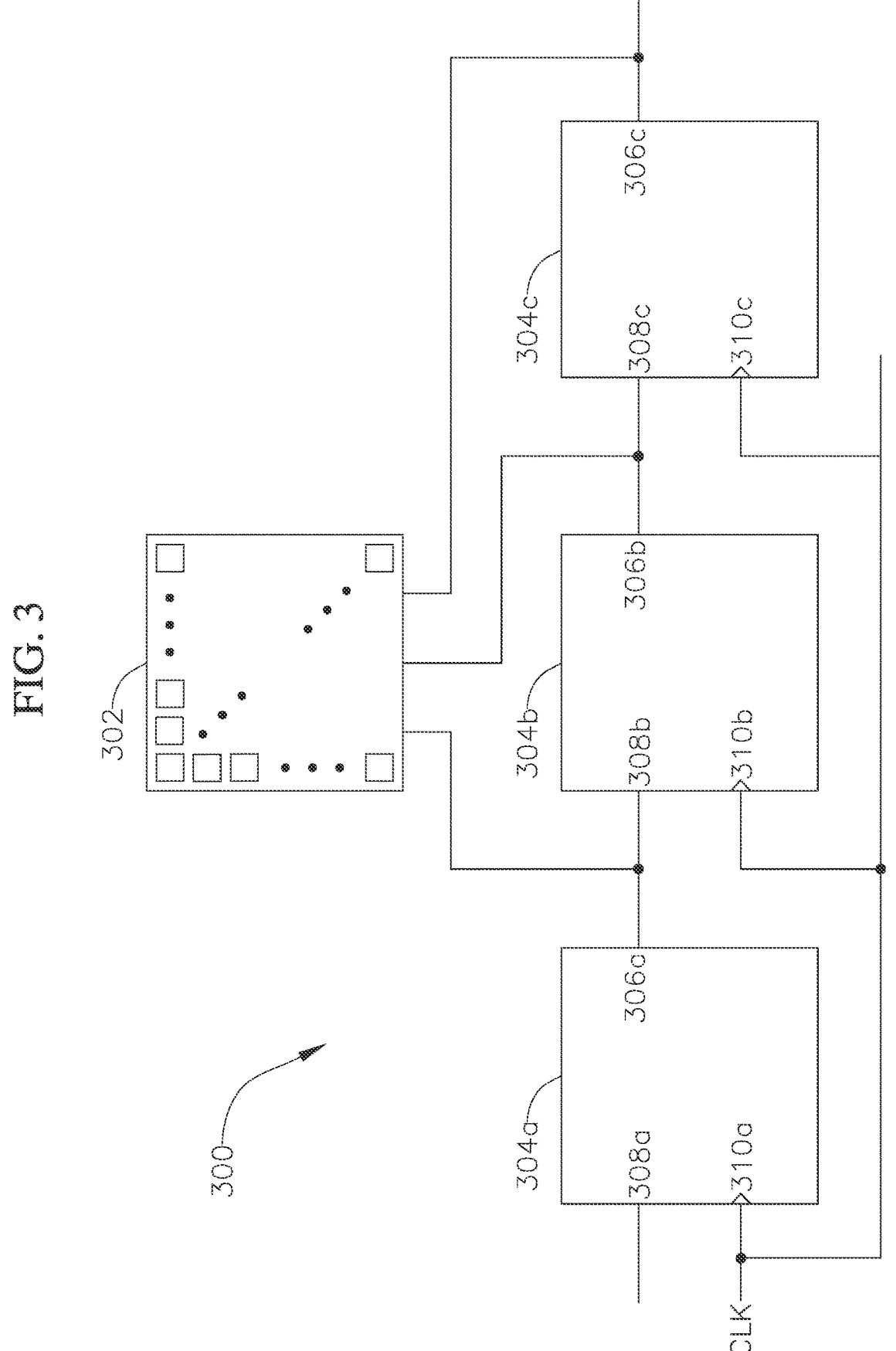
FIG. 3 is an example block diagram of a shift register, according to various embodiments of the present disclosure.

FIG. 3 is an example diagram of a shift register 300 coupled to a pixel array 302, according to various embodiments of the present disclosure. The shift register 300 may include a plurality of flip flops 304a, 304b, 304c connect in series and an output of a previous flip flop is coupled to an input of the next flip flop. For example, output 306a of flip flop 304a is coupled to input 308b of flip flop 304b, and so on. Furthermore, a common clock signal is coupled to the clock inputs 310a, 310b, 310c of flip flops 304a, 304b, 304c. Accordingly, a binary input may be provided to the first input 308a of flip flop 304a and after each clock cycle, the first input 308a is provided to the second input 308b. Each subsequent clock cycle causes the inputted binary data to cycle through to the next subsequent flip flop. In some embodiments, the outputs 306a, 306b, 306c may be provided to the pixel array 302. Accordingly, the corresponding pixels (i.e., the pixel which is coupled to the output of the shift register) may be selected to read-out based on the binary 1 or binary 0 that is provided to that pixel from the outputs of the flip flops of the shift register 300. It should be noted that the shift register illustrated in FIG. 3 is merely an example of one possible shift register and that other shift registers may be envisaged, for example, a shift register that includes more or fewer number of flip flops, and the outputs from the flip flops may be coupled to multiple pixels of the pixel array depending on the application.

Turning back to FIG. 2, the pixel array 200 may be divided into two bands, for example, an even band 206 and an odd band 207 of pixels, and a different shift register may be coupled to the pixels in each of the two bands. Thus, a first shift register 212 may be coupled to the pixels of the even band 206 and a second shift register 214 may be coupled to the pixels of the odd band 207. In some embodiments, the first and the second shift registers 214, 214 may operate independently of one another and in some embodiments, the first and the second shift registers 212, 214 may operate in cooperation with one another.

As described above, macro reading block 202 indicates a particular ROI that is selected by the first shift register 212 so that the information captured by the pixels from macro reading block 202 may be read-out. Next, if it is desired to select pixels of a different ROI, macro reading block 204 may be selected by the first shift register 212. For example, three clock cycles may be applied to the first shift register 212 to cause the selected ROI to shift from the location of macro reading block 202 to the right by three pixels to the location of macro reading block 204.

In some embodiments, a second shift register 214 may be coupled to the pixels of the odd band 207. Thus, the second shift register 214 may be configured to control the ROI in the odd band 207. Here, macro reading block 203 forms the ROI in the odd band 207 including eight pixels. The clock signal of the second shift register 214 may be cycled four times in this case to shift the ROI to the right by four pixels to form macro reading block 205. It should be noted here that the macro reading block 203 and macro reading block 205 do not overlap each other but the pixels from macro reading block 202 and macro reading block 204 do overlap with each other. Thus, the macro reading blocks may be selected to either overlap or not overlap depending on the application. Accordingly, the shift registers may be utilized to improve flexibility and variability of pixel selection and read-out.

Figure 4:
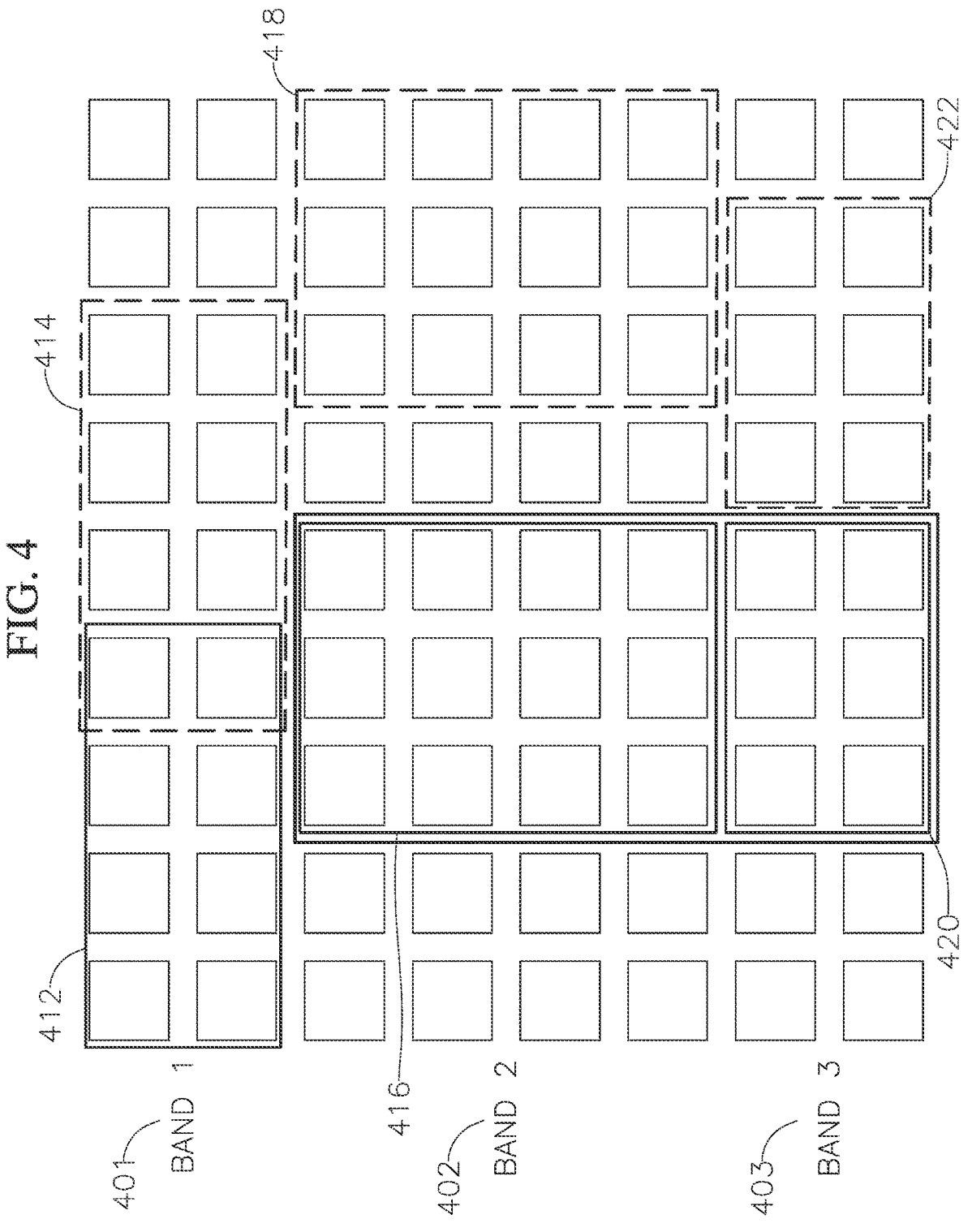
FIG. 4 is an example pixel array utilizing shift registers to configure macro reading blocks, according to various embodiments of the present disclosure.

FIG. 4 is an example pixel array of sensors 400 according to various embodiments of the present disclosure. The pixels shown in this embodiment are divided into a first band 401, a second band 402, and a third band 403. Each of the first band 401 and the third band 403 includes two rows of pixels and the second band 402 includes four rows of pixels. Furthermore, the first band is similar to the even band 206 shown in FIG. 2, wherein the first macro reading block 412 is shown around eight pixels covering a first ROI. A first shift register may be coupled to the first band 401 and may then shift the ROI to the right by selecting macro reading block 414 which is three pixels to the right.

In some embodiments, a second shift register may be coupled to the pixels in the second band 402 and a third shift register may be coupled to the pixels in the third band 403.

As shown, an ROI including 12 pixels (3×4 pixels) is formed by macro reading block 416 in the second band 402 and another ROI including 6 pixels (3×2 pixels) is formed by macro reading block 420 in the third band 403. In some embodiments, macro reading block 416 and macro reading block 420 may be independent of each other may simply be aligned one above the other by coincidence. Yet in some embodiments, the second shift register and the third shift register may operate in coordination with each other to align macro reading block 416 with macro reading block 420 so that a larger combined ROI may be selected comprising 18 pixels (3×6 pixels). Accordingly, the shift registers are able to select any number of m×n pixels of the pixel array and the second shift register may further select a different ROI by selecting macro reading block 418 and the third shift register may select a different ROI by selecting macro reading block 422. In other words, the shift registers may be cycled to shift or move the macro reading blocks in any direction, e.g., left or right in the first direction or up or down in the second direction depending on how the outputs of the shift registers are coupled to the pixel array and the cycling of the clock signal to the shift registers.

Figure 5:
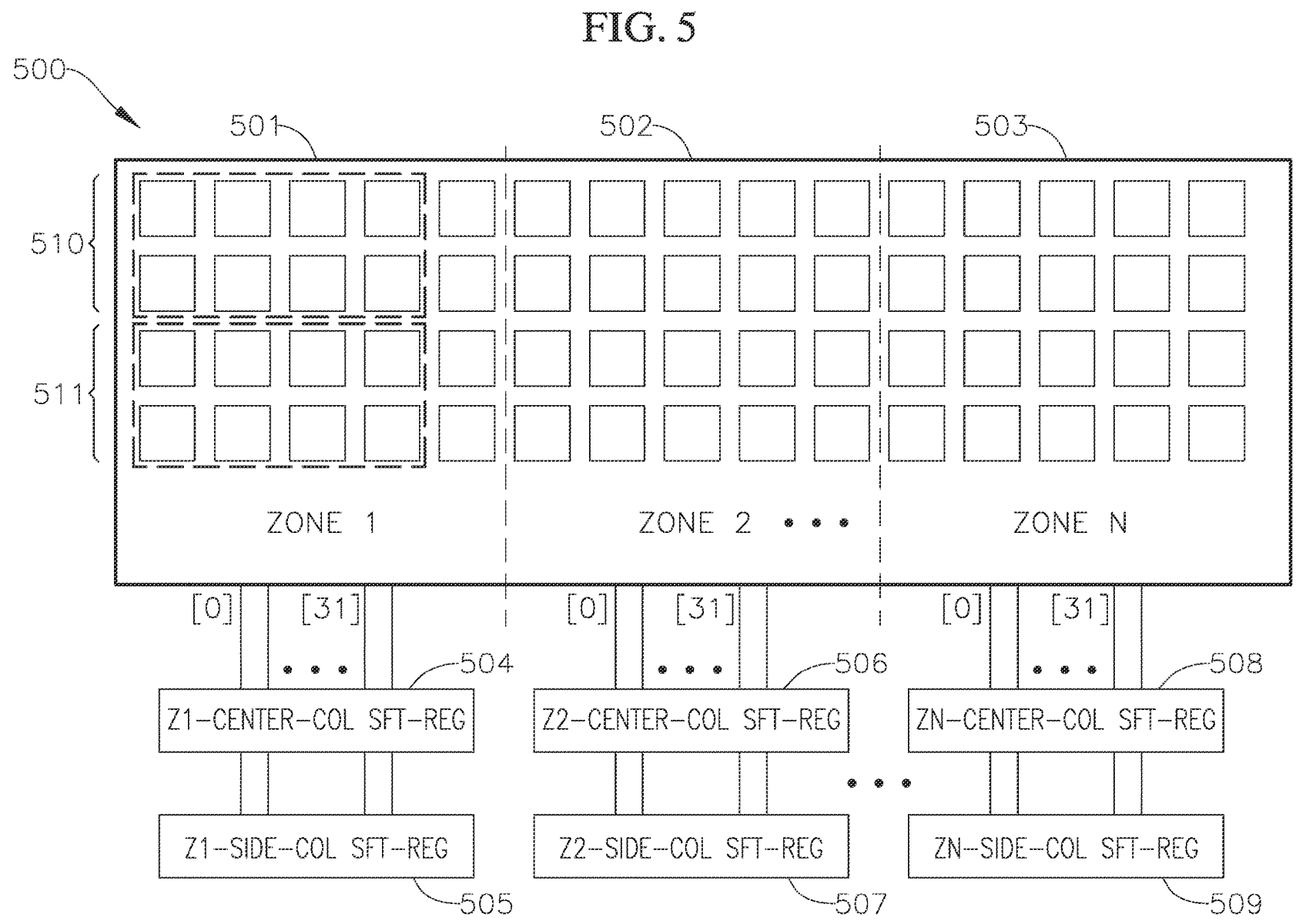

FIG. 5 is an example pixel array of sensors 500 that are divided into N zones. The pixels in each of the N zones may be coupled to one or more shift registers dedicated to that specific zone. For example, first shift registers 504 and 505 are coupled to the pixels in the first zone 501, second shift registers 506 and 507 are coupled to the pixels in the second zone 502, and third shift registers 508 and 509 are coupled to the pixels in the third zone 503. Furthermore, the pixels in the first zone 501 are divided into a first band 510 and a second band 511, and the top first shift register 504 is coupled to the pixels in the first band 510, and the bottom first shift register 505 is coupled to the pixels in the second band 511. A similar configuration may be achieved in the remaining zones (e.g., second zone 502, the N-th zone 503) to operate in a similar manner as the first zone 501.

In some embodiments, each of the shift registers may be a 32-bit shift register wherein 32 outputs from the shift register are coupled to 32 pixels in the respective zone. Thus, when the shift register produces an output of a binary 0, the pixel that is coupled to that output line is not selected (and therefore not read-out) and an output value of a binary 1 indicates that the pixel that is coupled to that output line is selected (and therefore read-out). As the clock signal of the shift register is cycled, the output from the shift register may shift, for example, to the right so the next pixel may be selected for read-out. While the embodiment illustrated in FIG. 5. illustrates zones that are divided vertically, similar zoning may be created horizontally as well.

FIG. 6 is a flow chart of a method for configuring macro reading block locations with shift registers, according to various embodiments of the present disclosure. According to a first step, a computer processor of a system (e.g., LIDAR, motion sensor, DVS) may determine a first ROI of a first pixel array (602). The ROI may be a region or a group of sensors of the pixel array that the system desires to read-out its data from. According to some embodiments of the present disclosure, a shift register may be coupled to the pixel array in the manner described and illustrated with reference to FIGS. 2, 4, and 5, and the shift register may select a first width and a first height corresponding to a first macro reading block of the first pixel array based on the first ROI (604). In other words, the clock input of the shift register may be cycled such that the outputs from the shift register selectively activate certain pixels based on the ROI such that a macro reading block is formed by the selected activated pixels. The macro reading block may include m×n pixels, which correspond to the first width (e.g., m pixels in the x-direction) and the first height (e.g., n pixels in the y-direction).

The ROI may be located at different regions or locations of the pixel array. Thus, the first shift register may select a first location in a first direction and a second direction of the first macro reading block to determine a first position of the first macro reading block of the first pixel array (606). For example, if it is desired to select a macro reading block towards an upper right corner of the pixel array, the shift register may activate the pixels forming the macro reading block in the upper right corer region of the pixel array. Accordingly, the data captured by the pixels of the first macro reading block at the first position may be read by a read-out circuit of the system (608). In some embodiments, the read-out circuit may be, for example, a read-out integrated circuit that is generally known by those having ordinary skill in the art. Accordingly, a macro reading block of pixels in an array may be selected within the ROI through the use of shift registers, and the data captured by those selected pixels may be read by a read-out circuit. Thus, power may be conserved by not having to read data from other regions, for example, regions that are not of interest. In some embodiments, a further clock signal may be applied to the shift registers to move the macro reading block (610) from a first position of the first pixel array to a second position of the first pixel array based on a clock cycle of the clock signal (612). Accordingly, as the ROI changes, the macro reading block may be moved or shifted across different regions or locations of the pixel array as desired based on the clock signal that is applied to the shift registers.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g., an application-specific integrated circuit), software, or a combination of software, firmware, and hardware, to process data or digital signals. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Circuit hardware may include, for example, application specific integrated circuits (ASICs), general purpose or special purpose central processing units (CPUs) that is configured to execute instructions stored in a non-transitory storage medium, digital signal processors (DSPs), graphics processing units (GPUs), and programmable logic devices such as field programmable gate arrays (FPGAs).

Further, the various components of these devices may be a process or thread, running on one or more processors, in one or more computing devices, executing computer program instructions and interacting with other system components for performing the various functionalities described herein. The computer program instructions are stored in a memory that may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Embodiments described herein are examples only. One skilled in the art may recognize various alternative embodiments from those specifically disclosed. Those alternative embodiments are also intended to be within the scope of this disclosure. As such, the embodiments are limited only by the following claims and their equivalents.

What is claimed is:

1. A system comprising:
   a first pixel array arranged in a first direction and a second direction; and
   a first shift register coupled to the first pixel array, an output signal of the first shift register configured to activate one or more pixels of the first pixel array, wherein remaining pixels of the first pixel array are deactivated from actively sensing and the activated pixels form a first macro reading block comprising at least one of a variable width or a variable height that is configured by the first shift register,
   the first shift register configured to receive a clock signal to move the first macro reading block in the first direction or the second direction.

2. The system of claim 1, further comprising a read-out circuit coupled to an output of the first pixel array to read data captured by the activated pixels of the first macro reading block.

3. The system of claim 1, wherein the activating the one or more pixels comprises selecting:
   the width of the first macro reading block in the first direction; and
   the height of the first macro reading block in the second direction.

4. The system of claim 3, wherein the activating the one or more pixels further comprises selecting:
   a first location of the first macro reading block in the first direction; and
   the first location of the first macro reading block in the second direction,
   the width, the height, and the first location of the first macro reading block forming a first region of interest (ROI) of the first pixel array.

5. The system of claim 4, wherein the first macro reading block is moved in the first direction or the second direction based on a second ROI of the first pixel array.

6. The system of claim 5, wherein at least one pixel of the first ROI overlap at least one pixel of the second ROI.

7. The system of claim 5, wherein the pixels of the first ROI are mutually exclusive of the pixels of the second ROI.

8. The system of claim 1, further comprising a second pixel array arranged in the first direction and the second direction, the second pixel array being adjacent the first pixel array; and
   a second shift register coupled to the second pixel array, an output signal of the second shift register configured to activate one or more pixels of the second pixel array, wherein the activated pixels form a second macro reading block, the second shift register configured to receive the clock signal to move the second macro reading block in the first direction or the second direction.

9. The system of claim 8, wherein the clock signal received by the first shift register is the same clock signal received by the second shift register.

10. The system of claim 9, wherein the second pixel array is adjacent the first pixel array in the second direction, and the first macro reading block is configured to move independently of the second macro reading block.

11. A method for reading pixels from the system of claim 1, the method comprising:

determining, by a processor, a first region of interest (ROI) of the first pixel array;

selecting, by the first shift register, a first width and a first height of the first macro reading block of the first pixel array based on the first ROI;

selecting, by the first shift register, a first location in the first direction and the second direction of the first macro reading block to determine a first position of the first macro reading block of the first pixel array;

reading, by a read-out circuit, data captured by the pixels of the first macro reading block at the first position;

applying a clock signal to the first shift register; and moving the first macro reading block from the first position of the first pixel array to a second position of the first pixel array based on a clock cycle of the clock signal.

12. A method for reading pixels, the method comprising:

determining, by a processor, a first region of interest (ROI) of a first pixel array;

selecting, by a first shift register, a first width and a first height of a first macro reading block of the first pixel array based on the first ROI;

selecting, by the first shift register, a first location in a first direction and a second direction of the first macro reading block to determine a first position of the first macro reading block of the first pixel array;

activating pixels of the first pixel array forming the first macro reading block, wherein the remaining pixels of the first pixel array are deactivated from actively sensing and the first macro reading block comprises the first width that is variable or the first height that is variable; and reading, by a read-out circuit, data captured by the pixels of the first macro reading block at the first position.

13. The method of claim 12, further comprising:

applying a clock signal to the first shift register; and moving the first macro reading block from the first position of the first pixel array to a second position of the first pixel array based on a clock cycle of the clock signal.

14. The method of claim 13, further comprising reading, by the read-out circuit, data captured by the pixels of the first macro reading block at the second position.

15. The method of claim 13, wherein at least one pixel of the first macro reading block at the first position overlap at least one pixel of the first macro reading block at the second position.

16. The method of claim 13, wherein the pixels of the first macro reading block at the first position are mutually exclusive of the pixels of the first macro reading block at the second position.

17. The method of claim 13, further comprising:

determining, by a processor, a second ROI of a second pixel array;

selecting, by a second shift register, a second width and a second height of a second macro reading block of the second pixel array based on the second ROI;

selecting, by the second shift register, a third location in the first direction and the second direction of the second macro reading block to determine a third position of the second macro reading block of the second pixel array; and reading, by the read-out circuit, data captured by the pixels of the second macro reading block at the second position.

18. The method of claim 17, further comprising:

applying the clock signal to the second shift register; and moving the second macro reading block from the third position of the second pixel array to a fourth position of the second pixel array based on the clock cycle of the clock signal.

19. The method of claim 18, further comprising reading, by the read-out circuit, data captured by the pixels of the second macro reading block at the fourth position.

20. The method of claim 19, wherein the first macro reading block at the first position is adjacent to the second macro reading block at the third position such that the first macro reading block and the second macro reading block are combined to form a third ROI larger than the first ROI or the second ROI.

* * * * *